United States Patent
Kennedy

(10) Patent No.: US 7,790,268 B2
(45) Date of Patent: Sep. 7, 2010

(54) CIRCUIT MATERIALS, MULTILAYER CIRCUITS, AND METHODS OF MANUFACTURE THEREOF

(75) Inventor: Scott D. Kennedy, Pomfret Center, CT (US)

(73) Assignee: World Properties, Inc., Lincolnwood, IL (US)

(*) Notice: Subject to any disclaimer, the term of this patent is extended or adjusted under 35 U.S.C. 154(b) by 74 days.

(21) Appl. No.: 12/100,705

(22) Filed: Apr. 10, 2008

(65) Prior Publication Data

US 2008/0254313 A1    Oct. 16, 2008

Related U.S. Application Data

(60) Provisional application No. 60/911,164, filed on Apr. 11, 2007.

(51) Int. Cl.
H05K 1/00    (2006.01)
H05K 1/02    (2006.01)

(52) U.S. Cl. .................. 428/209; 174/258; 174/259

(58) Field of Classification Search ............... 428/209, 428/901; 174/255–259
See application file for complete search history.

(56) References Cited

U.S. PATENT DOCUMENTS

| | | | |
|---|---|---|---|
| 3,244,795 A * | 4/1966 | Latimer | 174/259 |
| 3,668,057 A | 6/1972 | Agolini et al. | |
| 4,614,559 A * | 9/1986 | Shirasawa et al. | 156/182 |
| 5,719,354 A * | 2/1998 | Jester et al. | 174/255 |
| 6,224,965 B1 * | 5/2001 | Haas et al. | 428/209 |
| 6,320,140 B1 * | 11/2001 | Enomoto | 174/264 |
| 6,326,555 B1 * | 12/2001 | McCormack et al. | 174/255 |
| 6,538,211 B2 * | 3/2003 | St. Lawrence et al. | 174/258 |
| 6,602,583 B2 * | 8/2003 | St. Lawrence et al. | 428/209 |
| 6,931,723 B1 * | 8/2005 | Powell | 29/852 |
| 7,180,172 B2 * | 2/2007 | Sethumadhavan et al. | 257/702 |
| 7,227,179 B2 * | 6/2007 | St. Lawrence et al. | 257/40 |
| 7,549,220 B2 * | 6/2009 | Roseen et al. | 29/830 |

(Continued)

FOREIGN PATENT DOCUMENTS

EP    00870501 A2    8/1983

(Continued)

OTHER PUBLICATIONS

European Patent Office, PCT International Search Report, International Application No. PCT/US2008/059896, Date of Mailing: Nov. 4, 2008.

(Continued)

*Primary Examiner*—Cathy Lam
(74) *Attorney, Agent, or Firm*—Cantor Colburn LLP

(57) ABSTRACT

A circuit assembly comprises two or more circuit laminates, each comprising a conductive metal layer disposed on a poly (arylene ether ketone) substrate layer, wherein at least one of the conductive metal layers has been patterned to form a circuit, and a bond ply layer comprising a thermoplastic or thermosetting material. The thermoplastic bond ply has a melting point between 250° C. and 370° C., a decomposition temperature greater than about 290° C. and a dissipation factor of less than 0.01 at 10 GHz. The thermoset bond ply has a dissipation factor less than 0.01 at 10 GHz and a decomposition temperature greater than about 290° C. after lamination. Methods of forming the above circuit assemblies are also disclosed.

21 Claims, 2 Drawing Sheets

U.S. PATENT DOCUMENTS

2006/0134419 A1   6/2006   Monsheimer et al.

FOREIGN PATENT DOCUMENTS

| EP | 0148379 | A1 | 7/1985 |
|---|---|---|---|
| JP | 2000200976 | | 7/2000 |
| WO | 2006078027 | A1 | 7/2006 |

OTHER PUBLICATIONS

European Patent Office, PCT Written Opinion of the ISA, International Application No. PCT/US2008/059896, Date of Mailing: Nov. 4, 2008.

* cited by examiner

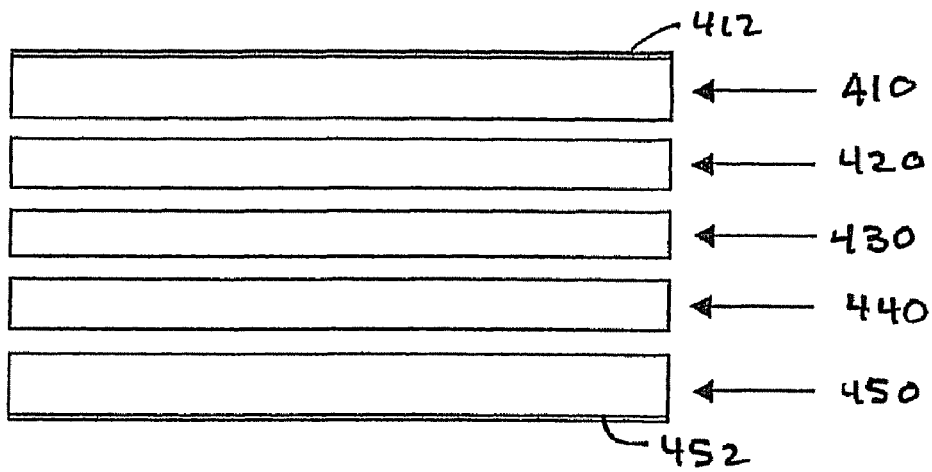
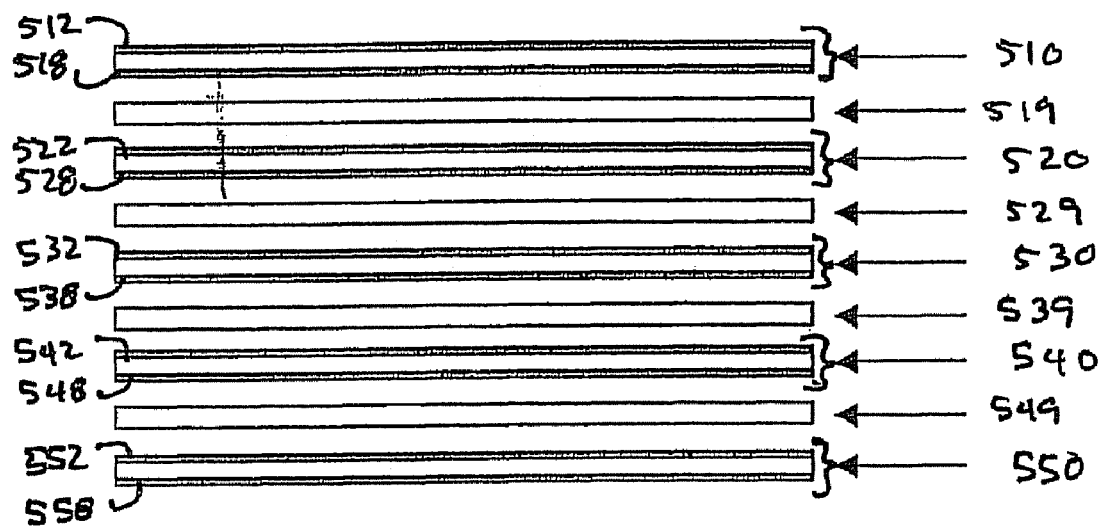

CIRCUIT MATERIALS, MULTILAYER CIRCUITS, AND METHODS OF MANUFACTURE THEREOF

CROSS-REFERENCE TO RELATED APPLICATION

This application claims the benefit of U.S. Provisional Application No. 60/911,164, filed Apr. 11, 2007, which is incorporated by reference herein in its entirety.

BACKGROUND OF INVENTION

This invention relates to materials and methods for the manufacture of circuit materials and multilayer circuits.

Printed circuit boards must meet increasingly stringent performance and environmental requirements. For example, advanced printed circuit boards incorporate more layers and operate at increasingly higher frequencies. Thinner layers are desirable, but potentially increase dielectric or circuit related losses. To meet this need, substrates that have a dielectric constant (Dk) less than 4 can be used, as such substrates can accommodate higher signal propagation speeds, while minimizing insertion loss.

For environmental reasons, manufacturers seek to reduce heavy metals in circuit assemblies. Lead-free solders meet this need, but require higher process temperatures that are harmful to multi-layer circuit materials having a high coefficient of thermal expansion (CTE) or low thermal stability. Such materials can delaminate, chemically degrade, or simply melt. Furthermore, again for environmental reasons, manufacturers of high frequency electronic devices also seek to essentially eliminate the use of chlorinated and brominated flame retardants to achieve the UL-94 V0 flammability rating.

The requirements for low Dk, low loss, high temperature resistance, and inherent flame retardancy create a need for new types of circuit substrates. One class of materials that meets this need is the poly(aryl ether ketone) polymers (PAEKs). PAEKs include poly(ether ether ketone) (PEEK), poly(ether ketone), (PEK), poly(ether ether ketone ketone) (PEEKK), poly(ether ketone ketone) (PEKK), and similar materials. This class of materials exhibits high temperature resistance (with melting points of 307° C. to 381° C.), and reasonably low dielectric constant and loss values.

In addition to the above advantages, PAEK polymers are easily extruded into thin films, and have a low coefficient of thermal expansion (CTE). A good in-plane CTE match to copper foil laminate cladding can be achieved by adding relatively small amounts of mineral or ceramic filler to the PAEK polymers. A good in-plane CTE match is important to achieve dimensional stability in the circuit when the copper foil is selectively etched to form a circuit layer. PAEK polymers therefore exhibit many of the advantages of liquid crystalline polymer laminates such as Rogers Ultralam® 3000, with the added advantage of a higher melting point.

While PAEK is an excellent candidate as a dielectric material for the production of copper clad high frequency circuit laminates, its use requires the concomitant development of new bonding materials that also exhibit low Dk, low loss, high temperature resistance, and inherent flame retardance. Such bonding materials (bond plies) are used to bond two more circuit laminates to provide a multilayer circuit assembly.

A number of thermoplastic, low dielectric loss bonding materials are commercially available and are used to laminate high frequency circuit assemblies. However, these materials can have low melting points that limit the maximum use temperature or processing temperature of circuit assemblies. CuClad® 6250 bond ply, available from Arlon Corporation, restricts use temperatures in multi-layer circuits to a maximum of 75° C. CuClad® 6700 bond ply, also available from Arlon, has a melting point of 184° C. Circuit assemblies built with this material would not survive the 220° C. or greater temperatures required for lead-free solder assembly.

Higher melting point thermoplastic bond plies, including DuPont Teflon® FEP (melting point=250° C.), Teflon® PFA (melting point=308° C.), and Rogers Ultralam® 3908 melting point=280° C.), have also been used in the manufacture of low loss, high frequency circuit boards. Although high melting substrates simplify the fabrication of multi-layer circuits, other factors such as the substrate modulus can be limiting. For example, a typical substrate material, Rogers Ultralam® 3850 (melting point=315° C.), can be used with a bond ply such as Ultralam® 3908. While there is a 35° C. temperature window between the melting points of this substrate and bond ply, the low modulus of the substrate at high temperature leads to distortion of the substrate during bonding. This distortion causes poor registration between the layers of the circuit assembly. On the other hand, if a substrate such as DuPont Teflon PFA film is used with a bond ply such as Ultralam® 3908, the 7° C. temperature window between the melting point of the substrate and that of the bond ply is too small to allow multi-layer circuits to be fabricated in an industrial process.

Thermosetting bond plies are also widely used in the multi-layer circuit industry. In recent years, the most commonly used material is "FR4," a family of flame retardant, epoxy fiberglass composite substrate materials and bonding plies. The glass transition temperature (Tg), decomposition temperature, and high frequency electrical properties depend on the precise formulation of the epoxy resin. Typically, the least expensive grades of FR4 that are used in lower frequency consumer products exhibit a Tg of about 125° C. and a dissipation factor (DF) at 10 GHz of greater than 0.02. Multi-layer circuits made with PAEK substrates and FR4 epoxy (Tg=125° C.) cannot survive the high temperature required for lead-free soldering. Such multi-layers also exhibit DF values that are too high for use in many high frequency devices.

The Isola Group manufactures a high performance FR4 formulation known as FR408, which exhibits a Tg of 180° C. and a DF of 0.013 at 10 GHz. Even with these improved properties of the thermosetting bonding ply, a circuit assembly made with this material and PAEK would not exhibit high performance. The lead-free solder temperature resistance would not be high enough for robust manufacturing nor would the DF of the multi-layer assembly be low enough for many high frequency applications.

Other low dielectric polymers are presently used as circuit materials, including phenol-formaldehyde resins, epoxy resins, and isoprene- and butadiene-based resins. While suitable for their intended purposes, there remains a continuing perceived need in the art for circuit materials with improved combinations of properties, in particular materials that have a combination of low dielectric constant and low loss, high temperature solder resistance, and flame retardance in the absence of brominated and/or chlorinated flame retardants.

BRIEF SUMMARY

The above-described drawbacks and disadvantages are alleviated by a circuit assembly, comprising two or more circuit laminates, each comprising a conductive metal layer disposed on a poly(arylene ether ketone) substrate layer, wherein at least one of the conductive metal layers has been patterned to form a circuit; and a thermoplastic bond ply layer disposed between the circuit laminates, wherein the bond ply has a melting point between 250° C. and 370° C., a decomposition temperature greater than about 290° C., and a dissipation factor of less than 0.01 at 10 GHz. These circuit materials are suitable for both flexible and rigid circuit board applications.

In another embodiment, a circuit assembly, comprises two or more circuit laminates, each comprising a conductive metal layer disposed on a poly(arylene ether ketone) substrate layer, wherein at least one of the conductive metal layers has been patterned to form a circuit; and a thermoset bond ply layer disposed between the conductive metal layers, wherein the bond ply has a dissipation factor of less than 0.01 at 10 GHz and a decomposition temperature greater than about 290° C.

A method of forming a circuit assembly comprises forming a layered structure comprising two or more circuit laminates, each comprising a conductive metal layer disposed on a poly(arylene ether ketone) substrate layer, wherein at least one of the conductive metal layers has been patterned to form a circuit; and a thermoplastic bond ply layer disposed between the circuit laminates, wherein the bond ply has a melting point between 250° C. and 370° C., a decomposition temperature greater than about 290° C., and a dissipation factor of less than 0.01 at 10 GHz, and laminating the layered structure to form a circuit assembly.

In another embodiment, a method of forming a circuit assembly comprises forming a layered structure comprising two or more circuit laminates, each comprising a conductive metal layer disposed on a poly(arylene ether ketone) substrate layer, wherein at least one of the conductive metal layers has been patterned to form a circuit; and a thermosetting bond ply layer disposed between the circuit laminates, and laminating the layered structure to form a circuit assembly, wherein the bond ply in the circuit assembly has a melting point between 250° C. and 370° C., a decomposition temperature greater than about 290° C., and a dissipation factor of less than 0.01 at 10 GHz.

The circuit assemblies disclosed herein are capable of high temperature, lead-free processing. The circuit assemblies can be manufactured to be halogen-free, and yet flame-resistant and therefore can be used to form flame-resistant circuit materials having excellent electrical and physical properties.

The above discussed and other features and advantages of the present disclosure will be appreciated and understood by those skilled in the art from the following detailed description and drawings.

BRIEF DESCRIPTION OF THE DRAWINGS

FIG. 4 is a schematic of the layer structure used in Example 9.

FIG. 5 is a schematic of the layer structure used in Example 10.

DETAILED DESCRIPTION

Figure 1:
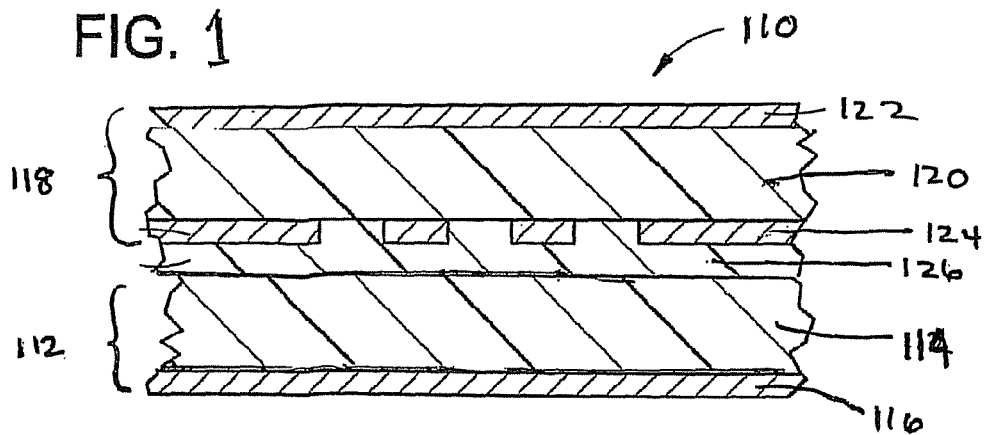
FIG. 1 is a schematic representation of an exemplary circuit assembly comprising a single circuit layer constructed from a single clad laminate in accordance with the invention.

The inventors hereof have found that circuit assemblies with excellent properties can unexpectedly be produced using a combination of certain materials, in particular a thermoplastic or thermoset bond ply (e.g. a liquid crystalline polymer or a polybutadiene and/or polyisoprene-containing polymer), and a dielectric substrate material comprising a poly(arylene ether ketone). Use of one of the specified bond ply materials in combination with a poly(arylene ether ketone) substrate allows the formation of circuit assemblies that do not distort, and that have good electrical and thermal properties. The circuit materials can be used in place of high frequency circuit materials that contain brominated flame retardants.

Circuit assemblies comprise a plurality of conductive layers, at least one of which has been patterned to produce a circuit. Typically, circuit assemblies are formed by laminating one or more patterned single or double clad laminates together using bond plies, and, in some cases, resin coated conductive layers, in proper alignment using heat and/or pressure. Patterning after lamination is another option. A single clad laminate has a conductive layer fixedly bound to a dielectric substrate layer. A double clad laminate has two conductive layers, one on each side of the substrate. Patterning a conductive layer, for example by etching, provides a circuit layer, and thus a circuit. A circuit laminate is a single or double clad laminate that has one or more circuit layers. Bond plies are used to provide adhesion between circuits and/or between a circuit layer and a conductive, unpatterned layer, or between two unpatterned conductive layers.

Circuit laminates for use in the circuit assemblies comprise a poly(arylene ether ketone) dielectric substrate layer and a conductive metal layer. At least one of the conductive metal layers has been patterned to form a circuit. A thermoplastic bond ply layer is disposed between the circuit laminates, The dielectric substrates comprise a PAEK resin system, a dielectric particulate filler system, and an optional fibrous web. The PAEK contains units of the formula —(—Ar—X—)— and the formula —(—Ar'—Y—)—, wherein Ar and Ar' are each independently a substituted or unsubstituted divalent aromatic compound, for example phenylene, naphthylene, and the like. Exemplary substituents include $C_{1-4}$ alkyl and alkoxy groups, halides, and combinations comprising at least one of the foregoing groups. Specific examples of Ar and Ar' include 1,4-phenylene, 4,4'-biphenylene, or 1,4-, 1,5-, or 2,6-naphthylene. Further, X is an electron-withdrawing group, specifically, carbonyl or sulfonyl; Y is a divalent group such as —O—, —S—, —CH$_2$—, isopropylidene, or the like, wherein at least 50%, more specifically, at least 70%, or even more specifically, at least 80%, of the groups X is a carbonyl group, and at least 50%, more specifically at least 70%, or even more specifically at least 80%, of the groups Y is —O—.

In a particularly useful embodiment, 100% of the groups X are carbonyl groups and 100% of the groups Y are oxygen. In this embodiment, the PAEK can be a polyether ether ketone (PEEK; formula I), a polyether ketone (PEK; formula II), a polyether ketone ketone (PEKK; formula III), or a polyether ether ketone ketone (PEEKK; formula IV), but other arrangements of the carbonyl groups and oxygen groups are also possible.

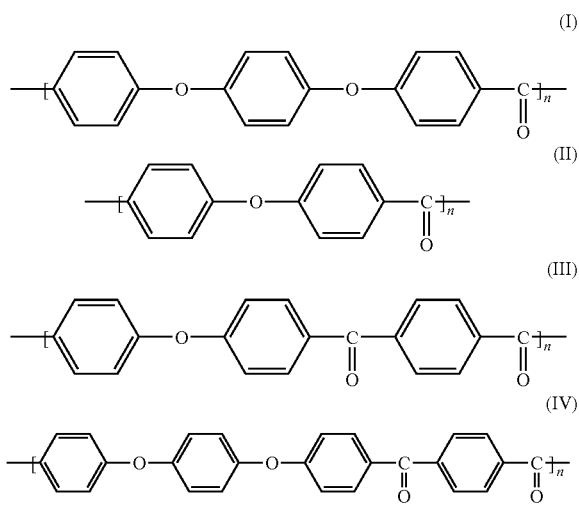

Exemplary commercially available PAEK materials include PEEK from Victrex (melting point 343° C.) and PEKK available under the tradename OXPEKK from Oxford Performance Materials Inc. (melting point, depending on the grade, from 307° C. to 360° C.).

In addition, the dielectric substrate can comprise one or more dielectric particulate fillers. Useful particulate fillers include, but are not limited to, titanium dioxide (rutile and anatase), barium titanate, $Ba_2Ti_9O_{20}$, strontium titanate, silica particles and hollow spheres, including fused amorphous silica and fumed silica, other hollow ceramic spheres, glass spheres, corundum, wollastonite, aramide fibers, for example, KEVLAR from DuPont, fiberglass, quartz, boron nitride, aluminum nitride, silicon carbide, beryllia, alumina, magnesium silicate hydroxide, $(Mg_3Si_4O_{10}(OH)_2$, talc), and magnesia. The particulate fillers can be used alone or in combination. To improve adhesion between the fillers and polymer, the filler can be treated with one or more coupling agents, such as silanes, zirconates, or titanates.

The total amount of dielectric particulate filler is about 10 to about 60 weight percent (wt %) of the total weight of the dielectric substrate. Specific amounts are about 20 to about 50 wt %, and even more specifically, about 30 to about 40 wt %, based on the total weight of the dielectric substrate.

A particularly useful filler in a rigid or flexible dielectric poly(arylene ether ketone), for example, polyether ether ketone, is talc. It has been found that talc-filled polyether ether ketone dielectric substrates can be electrically and thermo-mechanically equivalent to unfilled polyether ether ketone film, but with improved coefficient of thermal expansion (CTE). This is particularly useful for flexible circuit materials. In one embodiment, a talc-filled polyether ether ketone film has a CTE (measured from 30 to 150° C.) of less than 30 ppm/° C., specifically less than 25 ppm/° C. In one embodiment, an extruded 40 wt % talc-filled film has a CTE of 16.5 ppm/° C. in the machine direction, and a CTE of 22.5 ppm/° C. in the cross-machine direction.

Suitable talcs are of small particle size, for example having an average largest dimension of less than 10 micrometers, specifically less than 5 micrometers. An advantage of using talc is that it is inherently flame resistant and non-halogenated, and does not significantly adversely affect the electrical properties of the poly(arylene ether ketone) resin system. Poly(arylene ether ketone) resins with low amounts of talc also have low water absorption, and thus may be suitable for high humidity uses. In one embodiment, the talc is present in amount of about 5 to about 60 wt %, specifically about 10 to about 55 wt %, more specifically about 20 to about 50 wt % of the total weight of the substrate composition. A 40 wt % talc-filled polyether ether ketone is commercially available from, for example, Victrex PLC under the trade name VICTREX® PEEK™ 450TL40.

Particularly useful particulate fillers in rigid dielectric substrate materials include rutile titanium dioxide and amorphous silica, because these fillers have high and low dielectric constants, respectively, thereby permitting a broad range of dielectric constants combined with a low dissipation factor to be achieved in the final product by adjusting the respective amounts of the two fillers in the composition.

When used as a rigid dielectric substrate, the poly(arylene ether ketone) resin system can further comprise a fibrous web as reinforcement, a woven or non-woven assemblage of fibers capable of withstanding the processing conditions involved in the formation of the dielectric material, circuit board materials, and circuits formed therefrom. The fibrous web comprises thermally stable webs of a suitable fiber, specifically glass, for example, E, S, and D glass, or high temperature polymer fibers, for example, KODEL polyester from Eastman Kodak or polyphenylene sulfide fiber from Phillips Petroleum, liquid crystalline polymers such as VECTRAN from Kuraray and polyaramid fibers. Such thermally stable fiber reinforcement provides the dielectric substrate composite with the desired structural rigidity. In addition, the use of the fibrous web renders a dielectric material with a relatively high mechanical strength. Specific examples of fibrous webs are commercially available from, for example, Fiber Glast under the style designation "519-A" (0.0015 inches (38 micrometers) thick); Hexcel-Schwebel under the style designations "112" (0.0032 inches (81 micrometers) thick), "1674" (0.0045 inches (114 micrometers) thick), and "1080" (0.0025 inches (63.5 micrometers) thick); BGF under style designation "106" (0.0015 inches (38 micrometers) thick); and BGF under the style designation "7628" (0.0069 inches (175 micrometers) thick).

When present, the fibrous web generally comprises about 10 wt % to about 50 wt % of the total weight of the dielectric substrate. Specific amounts are about 15 wt % to about 40 wt %, or, more specifically, about 20 to about 30 wt %, based on the total weight of the dielectric substrate. When a fibrous web is present, the thickness of the dielectric substrate layer can be about 1 to about 120 mils (about 0.025 to about 3.05 millimeters), or, more specifically, about 5 to about 80 mils (about 0.13 to about 2.03 mm).

The poly(arylene ether ketone) resin system can further optionally comprise other additives known in the art, for example, antioxidants, and ultraviolet light absorbers. Since one of the significant advantages of using PEEK is its flame retardancy, in one embodiment, the compositions do not contain any added flame retardant. In another embodiment, the compositions do not contain any brominated or chlorinated flame retardant. It is nonetheless possible in still other embodiments to include non-halogenated and/or halogenated flame retardants, e.g., ethylene bistetrabromophthalimide, tetradecabromodiphenoxy benzene), and/or decabromodiphenoxyl oxide.

The dielectric substrate materials can be processed by methods known in the art. For example, all components (resins component(s) and optional additives) are thoroughly mixed in conventional mixing equipment in the melt. Mixing continues until resins and additives are uniformly dispersed throughout the composition. The mixture can be extruded to form a film. In one exemplary process, a rigid dielectric substrate comprising a fibrous web is prepared by placing the web between two poly(arylene ether ketone) resin films and pressed at a temperature and pressure and for a time effective to completely infiltrate the fibrous web with the resin. Suitable conditions for such infiltration can be readily determined by one of ordinary skill in the art without undue experimentation using the guidance provided herein, and will depend on factors such as the softening or melt temperature of the resin and the thickness of the fibrous web. Exemplary conditions are about 300 to about 400° C., O, specifically about 340 to about 360° C. (about 171 to about 182° C.), and about 100 to about 1200 pounds per square inch (psi) (about 0.689 to about 8.27 megaPascals (MPa)) for up to about three hours.

The circuit materials are most commonly used in the form of a single or double clad laminate. Single or double clad laminates can be prepared by layering the dielectric and the appropriate number of conductive metal layers, and laminating. Suitable conditions for lamination can be readily determined by one of ordinary skill in the art without undue experimentation using the guidance provided herein, and will depend on factors such as the softening or melt temperature of the resin and the thickness of the fibrous web if present. Exemplary conditions are about 300 to about 400° C. and about 100 to about 1200 psi (about 0.689 to about 8.27 Mpa) for up to about three hours. One or both of the conductive layers can be etched to provide a circuit.

Useful metals for the conductive layer in circuit laminates, patterned circuit layers, and circuit assemblies include stainless steel, copper, aluminum, zinc, iron, transition metals, and alloys comprising at least one of the foregoing, with copper specifically useful. There are no particular limitations regarding the thickness of the conductive layer, nor are there any limitations as to the shape, size, or texture of the surface of the conductive layer. Specifically, however, the conductive layer has a thickness of about 1 micrometer to about 200 micrometers, with about 9 micrometers to about 180 micrometers especially useful. When two or more conductive layers are present, the thickness of the two layers can be the same or different.

Copper conductive layers are especially useful. The copper foil can be made either by the electrodeposition (ED) on a rotating stainless steel drum from a copper sulfate bath, or by the rolling of solid copper bars. The copper conductive layer can be treated to increase surface area, treated with a stabilizer, for example, through stainproofing, to prevent oxidation of the conductive layer, or treated to form a thermal barrier. Both low and high roughness copper conductive layers treated with zinc or zinc alloy thermal barriers are particularly useful and can further optionally comprise a stain-proofing layer. Suitable copper conductive layers (foils) are commercially available from, for example, Circuit Foil under the trade name TWS, from Oak-Mitsui under the tradename MLS-TOC-500, SQ-VLP, and MQ-VLP, and from Furukawa Circuit Foils under the tradename F2-WS and FWL-WS.

The single or double clad laminates are used to construct circuit assemblies in combination with a bond ply. It has been found by the inventors hereof that for a circuit assembly to exhibit good layer-to-layer registration, the temperature of the lamination step should be below the melting point of the poly(arylene ether ketone) substrate material. Likewise, the melting point of a thermoplastic bond ply should not exceed 370° C.

It is further advantageous if the bond ply is capable of withstanding the higher processing temperatures encountered during lead-free component mounting. One common requirement for "lead-free" soldering is that the multi-layer assembly survives 10 minutes at a temperature of 288° C. without delamination. One material property that is often indicative of the ability to survive the 10 minutes at 288° C. is the "decomposition temperature," $T_d$. The decomposition temperature is measured using a thermogravimetric analyzer (TGA). The material to be tested is placed in the TGA and the temperature is increased at a rate of 10° C./minute. The $T_d$ is defined as the temperature at which the cumulative weight loss reaches 5%. In order to survive the 10 minutes at 288° C. delamination test, the $T_d$ needs to be greater than about 290° C.

A thermoplastic or a thermosetting material can be used as a bond ply. Suitable thermoplastic bond plies have a melting point between 250° C. and 370° C., a decomposition temperature greater than about 290° C. and a dissipation factor of less than 0.01 at 10 GHz. Exemplary thermoplastic materials include liquid crystalline polymers, polyimides, PFA, FEP, and PTFE.

Liquid crystalline bond ply compositions comprise materials as described, for example, in U.S. Pat. No. 6,602,583, which is incorporated herein by reference. Useful thermotropic liquid crystalline polymers include polymers comprising a segment of a polymer capable of forming an anisotropic molten phase as part of one polymer chain thereof and a segment of a polymer incapable of forming an anisotropic molten phase as the rest of the polymer chain, and also a composite of a plurality of thermotropic liquid crystalline polymers.

Representative examples of the monomers usable for the formation of the thermotropic liquid crystalline polymer include: compound a—an aromatic dicarboxylic acid compound, compound b—an aromatic hydroxy carboxylic acid compound, compound c—an aromatic diol compound, compound d—an aromatic dithiol d1, an aromatic thiophenol d2, and an aromatic thiol carboxylic acid compound d3, or compound e—an aromatic hydroxyamine compound and an aromatic diamine compound. They can sometimes be used alone, but can frequently be used in a combination of monomers a and c; a and d; a, b and c; a, b and e; a, b, c and e; or the like.

Examples of the aromatic dicarboxylic acid compound a include aromatic dicarboxylic acids such as terephthalic acid, 4,4'-diphenyldicarboxylic acid, 4,4'-triphenyldicarboxylic acid, 2,6-naphthalenedicarboxylic acid, 1,4-naphthalenedicarboxylic acid, 2,7-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and 1,6-naphthalenedicarboxylic acid; and alkyl-, alkoxy- and halogen-substituted derivatives of the above-mentioned aromatic dicarboxylic acids, such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Examples of the aromatic hydroxy carboxylic acid compound b include aromatic hydroxy carboxylic acids such as 4-hydroxybenzoic acid, 3-hydroxybenzoic acid, 6-hydroxy-2-naphthoic acid, and 6-hydroxy-1-naphthoic acid; and alkyl-, alkoxy- and halogen-substituted derivatives of the aromatic hydroxy carboxylic acids, such as 3-methyl-4-hydroxybenzoic acid, 3,5-dimethyl-4-hydroxybenzoic acid, 6-hydroxy-5-methyl-2-naphthoic acid, 6-hydroxy-5-methoxy-2-naphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Examples of the aromatic diol compound c include aromatic diols such as 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis4-hydroxyphenoxyethane, 3,3'-dihydroxydiphenyl ether, 1,6-naphthalenediol, 2,2-bis-4-hydroxyphenyl propane, and bis-4-hydroxyphenylmethane; and alkyl-, alkoxy- and halogen-substituted derivatives of the aromatic diols, such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Examples of the aromatic dithiol d1 include benzene-1,4-dithiol, benzene-1,3-dithiol, 2,6-naphthalene-dithiol, and 2,7-naphthalene-dithiol. Examples of the aromatic thiophenol d2 include 4-mercaptophenol, 3-mercaptophenol, and 6-mercaptophenol. Examples of the aromatic thiol carboxylic acid d3 include 4-mercaptobenzoic acid, 3-mercaptobenzoic acid, 6-mercapto-2-naphthoic acid, and 7-mercapto-2-naphthoic acid.

Examples of the aromatic hydroxyamine compound and the aromatic diamine compound e include 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methyl-4-aminophenol, 2-chloro-4-aminophenol, 4-amino-12-naphthol, 4-amino-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl sulfide thiodianiline, 4,4'-diaminodiphenyl sulfone, 2,5-diaminotoluene, 4,4'-ethylenedianiline, 4,4'-diaminodiphenoxyethane, 4,4'-diaminodiphenylmethane methylenedianiline, and 4,4'-diaminodiphenyl ether oxydianiline.

The molecular weight of the thermotropic liquid crystalline polyester can be about 2,000 to 200,000, preferably 4,000 to 100,000. The measurement of the molecular weight can be done, for example, either through determination of the terminal groups of a compressed film thereof according to infrared spectroscopy, or by gel permeation chromatography GPC.

Thermotropic liquid crystalline polymers can be used either alone or in mixture of at least two thereof. A preferred thermotropic liquid crystalline polymer composition is 2-naphthalene carboxylic acid, 6-acetyloxy-polymer with 4-acetyloxy benzoic acid.

In general, these thermoplastic bond ply compositions are processed as follows. First, all components (bond ply resins and optional additives) are thoroughly melt mixed in conventional mixing equipment. The mixing temperature is regulated to avoid substantial decomposition of the components. Mixing continues until resins and additives are uniformly dispersed throughout the composition. The melt mix is extruded to form a layer at the correct thickness, and then cooled. Useful bond plies comprising a liquid crystalline polymer are commercially available from Rogers under the registered tradename Ultralam 3908. Other thermoplastic bond ply materials include FEP, PFA, or PTFE fluoropolymers available from DuPont.

Suitable thermosetting bond plies have a decomposition temperature greater than about 290° C. and a dissipation factor (DF) less than 0.01 at 10 GHz by IPC-TM-650 2.5.5.5c x-band stripline resonance test methods. Exemplary thermosetting bond ply materials include a polybutadiene and/or polyisoprene polymer and expanded PTFE impregnated with thermosetting material.

Suitable polyisoprene and/or polybutadiene polymer systems are described, for example, in U.S. Pat. No. 6,071,836, which is incorporated by reference in its entirety. As used herein, the term thermosetting "polybutadiene and/or polyisoprene resin" includes homopolymers and copolymers comprising units derived from butadiene, isoprene, or mixtures thereof. Units derived from other copolymerizable monomers can also be present in the resin, for example, in the form of grafts. Exemplary copolymerizable monomers include, but are not limited to, vinylaromatic monomers, for example, substituted and unsubstituted monovinylaromatic monomers such as styrene, 3-methylstyrene, 3,5-diethylstyrene, 4-n-propylstyrene, alpha-methylstyrene, alpha-methyl vinyltoluene, para-hydroxystyrene, para-methoxystyrene, alpha-chlorostyrene, alpha-bromostyrene, dichlorostyrene, dibromostyrene, tetra-chlorostyrene; and substituted and unsubstituted divinylaromatic monomers such as divinylbenzene, divinyltoluene. Combinations comprising at least one of the foregoing copolymerizable monomers can also be used. Exemplary thermosetting polybutadiene and/or polyisoprene resins include but are not limited to butadiene homopolymers, isoprene homopolymers, butadiene-vinylaromatic copolymers such as butadiene-styrene, isoprene-vinylaromatic copolymers such as isoprene-styrene copolymers.

The thermosetting polybutadiene and/or polyisoprene resins in the bond ply system can also be modified, for example, the resins can be hydroxyl-terminated, methacrylate-terminated, carboxylate-terminated resins. Post-reacted resins can be used, such as epoxy-, maleic anhydride-, or urethane-modified butadiene or isoprene resins. The resins can also be crosslinked, for example, by divinylaromatic compounds such as divinyl benzene, for example, a polybutadiene-styrene crosslinked with divinyl benzene. Suitable resins are broadly classified as "polybutadienes" by their manufacturers, for example Nippon Soda Co., Tokyo, Japan, and Sartomer Company Inc., Exton, Pa. Mixtures of resins can also be used, for example, a mixture of a polybutadiene homopolymer and a poly(butadiene-isoprene) copolymer. Combinations comprising a syndiotactic polybutadiene can also be useful.

The thermosetting polybutadiene and/or polyisoprene resin in the bond ply system can be liquid or solid at room temperature, with liquid resins preferred, in order to provide a viscosity suitable for processing. Suitable liquid resins can have a number average molecular weight greater than about 5,000, but generally have a number average molecular weight of less than about 5,000, or, more specifically, about 1,000 to about 3,000. Thermosetting polybutadiene and/or polyisoprene resins having at least 90 wt. % 1,2-addition are preferred because they exhibit the greatest crosslink density upon cure, due to the large number of pendent vinyl groups available for crosslinking.

The polybutadiene and/or polyisoprene resin is present in the bond ply resin system in an amount of up to about 60 wt. % of the total bond ply resin system, more specifically, about 10 to about 55 wt. %, or, even more specifically, about 15 to about 45 wt. %, based on the total bond ply resin system.

Other polymers that can co-cure with the thermosetting polybutadiene and/or polyisoprene resins in the bond ply system can be added for specific property or processing modifications. For example, in order to improve the stability of the dielectric strength and mechanical properties of the electrical substrate material over time, a lower molecular weight ethylene propylene elastomer can be used in the resin systems. An ethylene propylene elastomer as used herein is a copolymer, terpolymer, or other polymer comprising primarily ethylene and propylene. Ethylene propylene elastomers can be further classified as EPM copolymers (i.e., copolymers of ethylene and propylene monomers) or EPDM terpolymers (i.e., terpolymers of ethylene, propylene, and diene monomers). Ethylene propylene diene terpolymer rubbers, in particular, have saturated main chains, with unsaturation available off the main chain for facile cross-linking. Liquid ethylene propylene diene terpolymer rubbers, in which the diene is dicyclopentadiene, are preferred.

Useful molecular weights of the ethylene propylene rubbers are less than 10,000 viscosity average molecular weight. Suitable ethylene propylene rubbers include an ethylene propylene rubber having a viscosity average molecular weight (MV) of about 7,200, which is available from Uniroyal Chemical Co., Middlebury, Conn., under the trade name Trilene CP80; a liquid ethylene propylene dicyclopentadiene terpolymer rubbers having a molecular weight of about 7,000, which is available from Uniroyal Chemical Co. under the trade name of Trilene 65; and a liquid ethylene propylene ethylidene norbornene terpolymer, having a molecular weight of about 7,500, which is available from Uniroyal Chemical Co. under the name Trilene 67.

The ethylene propylene rubber is preferably present in an amount effective to maintain the stability of the properties of the bond ply over time, in particular the dielectric strength and mechanical properties. Typically, such amounts are up to about 20 wt. % with respect to the total weight of the bond ply resin system, more specifically about 4 to about 20 wt. %, even more specifically about 6 to about 12 wt. %.

Another type of co-curable polymer to be used in the bond ply system is an unsaturated polybutadiene- or polyisoprene-containing elastomer. This component can be a random or block copolymer of primarily 1,3-addition butadiene or isoprene with an ethylenically unsaturated monomer, for example a vinylaromatic compound such as styrene or alpha-methyl styrene, an acrylate or methacrylate such a methyl methacrylate, or acrylonitrile. The elastomer is preferably a solid, thermoplastic elastomer comprising a linear or graft-type block copolymer having a polybutadiene or polyisoprene block, and a thermoplastic block that preferably is derived from a monovinylaromatic monomer such as styrene or alpha-methyl styrene. Suitable block copolymers of this type include styrene-butadiene-styrene triblock copolymers, for example those available from Dexco Polymers, Houston, Tex., under the trade name Vector 8508M, from Enichem Elastomers America, Houston, Tex., under the trade name Sol-T-6302, and those from Fina Oil and Chemical Company, Dallas, Tex., under the trade name Finaprene 401; styrene-butadiene diblock copolymers; and mixed triblock and diblock copolymers containing styrene and butadiene, for example those available from Shell Chemical Corporation, Houston, Tex., under the trade name Kraton D1118X. Kraton D1118X is a mixed diblock/triblock styrene and butadiene containing copolymer, containing 30 vol. % styrene.

The optional polybutadiene- or polyisoprene-containing elastomer in the bond ply system can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. An exemplary second block copolymer of this type is Kraton GX1855 (commercially available from Shell Chemical Corp.), which is believed to be a mixture of a styrene-high 1,2-butadiene-styrene block copolymer and a styrene-(ethylene-propylene)-styrene block copolymer.

Typically, the unsaturated polybutadiene- or polyisoprene-containing elastomer component is present in the bond ply resin system in an amount of about 10 to about 60 wt. % with respect to the total bond ply resin system, more specifically about 20 to about 50 wt. %, or even more specifically about 25 to about 40 wt. %.

Free radical-curable monomers can also be added for specific property or processing modifications, for example to increase the crosslink density of the bond ply resin system after cure. Exemplary monomers that can be suitable crosslinking agents include, for example, di, tri-, or higher ethylenically unsaturated monomers such as divinyl benzene, triallyl cyanurate, diallyl phthalate, and multifunctional acrylate monomers, for example, Sartomer resins available from Arco Specialty Chemicals Co., Newtown Square, Pa., or combinations thereof, all of which are commercially available. The crosslinking agent, when used, is present in resin system in an amount of up to about 20 vol. %, based on the total weight of the bond ply resin system.

A curing agent can be added to the bond ply resin system to accelerate the curing reaction of the polyenes having olefinic reactive sites. Specifically, useful curing agents are organic peroxides such as dicumyl peroxide, t-butyl perbenzoate, 2,5-dimethyl-2,5-di(t-butyl peroxy)hexane, $\alpha,\alpha$-di-bis(t-butyl peroxy)diisopropylbenzene, and 2,5-dimethyl-2,5-di(t-butyl peroxy)hexyne-3, all of which are commercially available. They can be used alone or in combination. Typical amounts of curing agent are from about 1.5 to about 10 wt. % of the total bond ply resin composition.

In general, thermosetting bond ply compositions are processed as follows. First, all components (bond ply resins and optional additives) are thoroughly mixed to form a slurry in conventional mixing equipment. The mixing temperature is regulated to avoid substantial decomposition of the curing initiator. Mixing continues until resins and additives are uniformly dispersed throughout the composition. The slurry is cast to form a layer, metered to the correct thickness, and then solvent is removed (evaporated) to form a prepreg. Useful bond plies comprising a polybutadiene and/or polyisoprene polymer are commercially available from Rogers Corporation under the registered trade names, RO4450B, RO4450F and RO4430

Either thermoplastic or thermosetting bond ply composition can optionally further comprise particulate fillers as described above. These fillers can be used alone or in combination. In one embodiment the type and amount of filler, for example fused amorphous silica, is selected so as to provide a composition that has very little tackiness and can therefore be easily handled by operators. This low tackiness feature allows for the use of conventional automated layup processing, including foil cladding, using one or more known roll laminators. While the bond ply is tack-free enough to be handled relatively easily by hand, it is also tacky enough to be tacked to itself using a roll laminator, for example, a nip roller, at room temperature. The bond ply composition can further optionally include additives such as antioxidants and fire-retardant additives, such as bromine containing flame retardants.

In one embodiment, a circuit assembly in accordance with the invention is manufactured by forming a stack comprising a bond ply layer disposed between one or more single or double clad circuit laminates, and laminating the multi-layer stack. The bond ply layer can be formed from one or more bond plies or bond ply prepregs (i.e. materials pre-impregnated with other materials). Similarly, the dielectric substrate layer can be formed from one or more dielectric substrate layers or prepregs. Most commonly, the conductive layer of the single or double clad circuit laminate will be etched to provide a circuit. Suitable conditions for the lamination can be readily determined by one of ordinary skill in the art without undue experimentation using the guidance provided herein, and will depend on factors such as the softening or melt temperature of the resin and the thickness of the substrate. Exemplary conditions are 150-320° C., 50-500 pounds per square inch (psi) (0.345-3.45 MPa) for up to about three hours. Additional layers can be present, for example, additional conductive layers, substrates, and/or bond ply layers, to make a circuit assembly.

Many different multi-layer circuit configurations can be formed using the above substrates. An exemplary embodiment is shown in FIG. 1, wherein a circuit assembly 110 comprises a single clad laminate 112 comprising a dielectric layer 114 and a conductive layer 116, and a double clad laminate 118 comprising a dielectric layer 120, a conductive layer 122 and a circuit layer 124, wherein at least one, and preferably both, of the dielectric layers 114, 120 is a poly(arylene ether ketone) dielectric substrate material. Bond ply layer 126 is a thermoplastic or thermosetting material as described above. One or both of the dielectric layers 114, 120 can comprise a woven web and/or a particulate filler (not shown).

Figure 2:
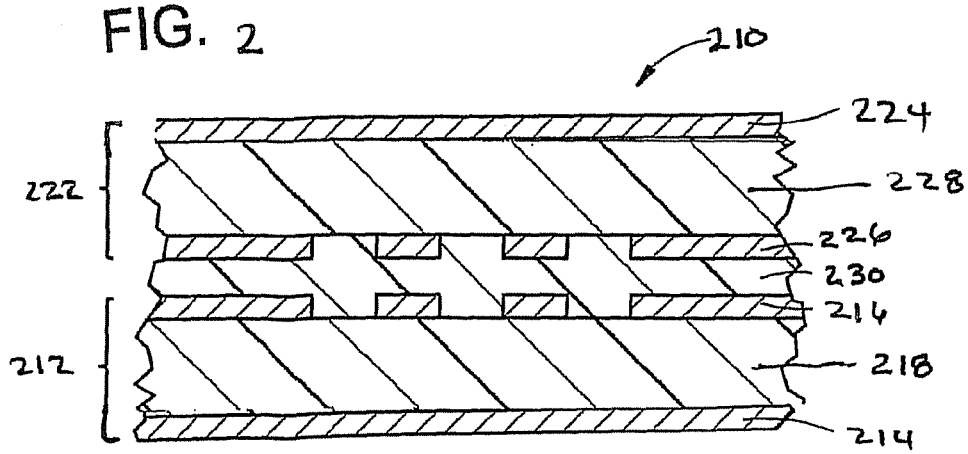
FIG. 2 is a schematic representation of an exemplary circuit assembly comprising a single circuit layer constructed from a double clad laminate in accordance with the invention.

Another embodiment of a multilayer circuit assembly is shown at 210 in FIG. 2. Assembly 210 comprises a double clad circuit layer 212 comprising a conductive layer 214 and a circuit layer 216 disposed on opposite sides of a dielectric substrate layer 218, and another double clad circuit layer 222 comprising a conductive layer 224 and a circuit layer 226 disposed on opposite sides of a dielectric substrate layer 228, wherein at least one, and preferably both, of dielectric layers 218, 228 is a poly(arylene ether ketone) dielectric substrate. Bond ply layer 230 is a thermoplastic or thermosetting material as described above. One or both of the dielectric layers 218, 228 can comprise a woven web and/or a particulate filler (not shown). One or both of conductive layers 214, 224 can be circuitized (not shown).

Figure 3:
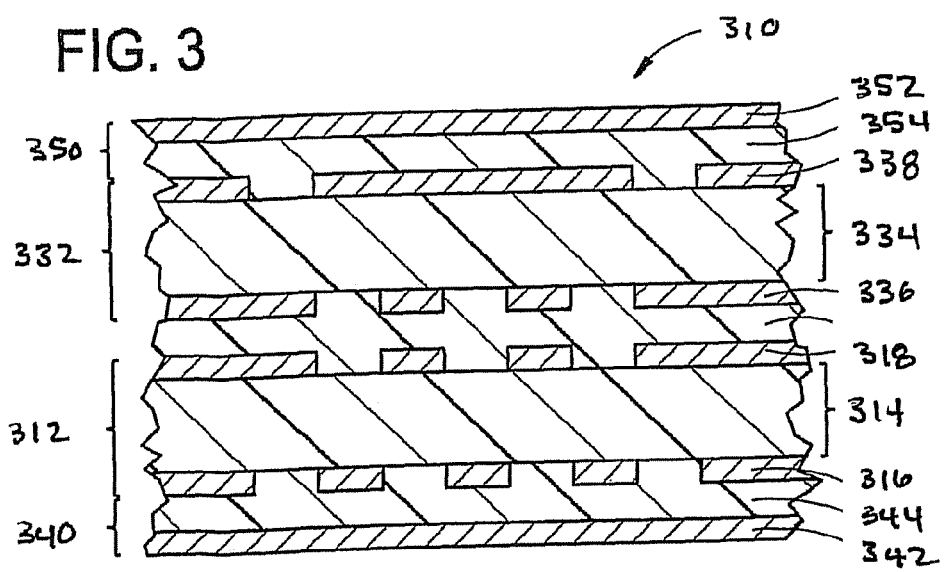
FIG. 3 is a schematic representation of an exemplary circuit assembly comprising three circuit layers constructed from two double clad laminates in accordance with the present invention.

FIG. 3 shows an exemplary circuit assembly 310 having a first double clad circuit 312, a second double clad circuit 332, and a bond ply 322. Double clad circuit 312 comprises a dielectric substrate 314 disposed between two conductive circuit layers 316, 318. Double clad circuit 332 comprises a dielectric substrate 334 disposed between two conductive circuit layers 336, 338. At least one, and preferably both, of dielectric layers 314, 334 is a poly(arylene ether ketone) dielectric substrate. Each dielectric substrate layer 314, 334 can comprise particulate filler and/or a nonwoven glass reinforcement (not shown). Two cap layers, 340, 350 are also shown. Each cap layer 340, 350 includes a conductive layer 342, 352 disposed on a bond ply layer 344, 354. At least one, and preferably all of the bond ply layers 322, 344, 354 comprise thermoplastic or thermosetting adhesive as described above.

Use of PAEKs as described herein is advantageous because PAEKs are high melting point (about 300° C. to 381° C.) semi-crystalline polymers with a dielectric constant less than 4, exhibiting low loss in a circuit assembly. PAEKs are also UL 94 V-0 flame retardant without additives, passing the strictest definition of being "green" (environmentally friendly) materials. PAEKs are also easily extruded into thin films. Furthermore, the coefficient of thermal expansion (CTE) of the PAEK polymers is low enough to achieve a good in-plane CTE match to the copper foil laminate cladding by adding relatively small amounts of mineral or ceramic filler. The in-plane CTE match is important to the "dimensional stability" when the copper foil is selectively etched to form a circuit layer. Thus, the material exhibits many of the advantages of liquid crystalline polymer laminates such as Rogers Ultralam3000 with the added advantage of a higher melting point.

The PAEK material's higher melting point substantially increases the process window when bonding a multi-layer circuit with high temperature bond plies, such as Teflon PFA or Ultralam 3908. With suitably chosen low dielectric loss, high melting point thermoplastic bond plies, high frequency low loss, multi-layer circuits that survive lead-free soldering temperatures can be reliably manufactured using copper clad laminates based on PEEK polymer The circuit laminates as described above have acceptable dielectric properties, that is, a dielectric constant of less than about 4, specifically less than about 3.8, more specifically less than about 3.6; and a dissipation factor of less than about 0.015, more specifically, less than about 0.010, even more specifically, less than about 0.008, each measured over 1 to 10 gigahertz GHz.

In addition, circuit laminates are rated V-0 when measured according to UL-94, with a burn time of about 1 second. In a specific embodiment, circuit laminates are rated V-0 when measured according to UL-94, with a burn time of about 1 second even without presence of a bromine or chlorine containing flame retardant additive. This is a significant advantage over current low dielectric substrates, which are often not flame retardant, and therefore are used with bromine-containing additives to achieve a UL 94 rating of V-0. Due to new legislation in, for example, Europe and Japan, there is a great interest in removing bromine and chlorine in the manufacture of circuit assemblies. Unfortunately, substitution of the bromine-containing compounds with other flame retardant additives often requires the addition of large amounts of additive, which can be detrimental to the electrical properties of laminates made with the polymeric materials.

In another embodiment, the Z-axis coefficient of thermal expansion is less than about 60 ppm, more specifically less than about 40 ppm.

The invention is further illustrated by the following non-limiting examples.

EXAMPLES

The dielectric substrate materials used in the preparation of the following examples include a 40 wt % talc-filled polyether ether ketone (PEEK), commercially available from Victrex under the trade name Victrex® PEEK™ 450TL40, and a polybutadiene-based polymer, available under the trade name RO4350B from Rogers Corp. The glass cloth used in preparing the laminates of the examples is style 1080/767 woven glass cloth, commercially available from Hexcel-Schwebel Corporation. The copper foils used to prepare the laminates was 12-ounce per square foot (oz./ft$^2$) copper foil obtained from Mitsui Mining and Smelting and Circuit Foils Luxembourg under the trade names MQ-VLP and TWS, respectively. Two different bond plies were used, a polybutadiene-based bond ply available under the trade name RO4450B, and a liquid crystalline polymer bond ply available under the trade name R/flex 3908, both from Rogers Corp.

Dielectric constant (Dk) was determined according to the IPC-TM-650-2.5.5.5.1 clamped stripline test method at 10 GHz.

Dissipation factor (Df) was determined according to the IPC-TM-650-2.5.5.5.1 clamped stripline test method at 10 GHz.

Copper bond testing was performed according to method A of IPC TM-650, 2.4.9. A sliding plate test fixture and a TMI tester were used. The copper foil was not plated to 1 ounce prior to testing.

Percent water absorption was determined according to ASTM D570.

Solder resistance testing was performed by floating 5.08 cm×5.08 cm (2-inch×2-inch) coupons for a continuous 60-second period at each temperature. The resistance temperature was determined to be the highest temperature that each sample was able to endure without showing visual evidence of blistering, delamination, or distortion.

Solder float testing was performed according to IPC TM-650, 2.4.13.

Flame/flameout testing is performed according to Underwriter's Laboratory Method UL-94. A flame having an inner cone of height 1.9 cm (¾ inches) is applied to each specimen so that a distance of 1.0 cm (⅜ inch) separates the lower end of the specimen from base of the flame. The flame is held in that position for 10 seconds and then removed. A burn time T1 is defined as the time required for the flame issuing from the specimen to disappear. If burning of the specimen ceases within a T1 of 30 seconds, the flame is reapplied for an additional 10 seconds and a second burn time T2 is determined. For a V-0 rating, no individual burn times, from the first or second application can exceed 10 seconds. The total of the burn times for any five specimens cannot exceed 50 seconds. Drip particles that ignite a piece of cotton gauze situated below the specimen are not allowed. For a V-1 rating, no individual burn times, from the first or second application can exceed 30 seconds. The total of the burn times for any five specimens can not exceed 250 seconds. Drip particles that ignite a piece of cotton gauze situated below the specimen are not allowed. An F rating indicates flammable.

Example 1

A 50.8 micrometer (2 mil) thick unfilled PEEK film from Ajedium Film Group, LLC (Newark, Del.) was melt laminated to ½ Oz MQ-VLP copper foil (Mitsui Mining and Smelting, Japan) to make double sided copper clad laminates. The material was laminated at 350° C. and 5.52 MPa (800 psi) for 45 minutes in an oil heated vacuum press. Some properties of these laminates are shown in Table 1.

Example 2

A 50.8 micrometer (2 mil) thick 40 wt % talc polyether ether ketone film, Victrex® PEEK™ 450TL40, from Ajedium Film Group, LLC (Newark, Del.) was melt laminated to ½ Oz MQ-VLP copper foil (Mitsui Mining and Smelting, Japan) to make a double sided copper clad laminate. The material was laminated at 350° C. and 5.52 MPa (800 psi) for 45 minutes in an oil heated vacuum press. Some properties of this non-reinforced PEEK laminate are shown in Table 1. As shown in Table 1, the addition of the talc filler decreases the CTE and results in a significant improvement in the dimensional stability.

TABLE 1

| Property | Unfilled PEEK Laminate | | | 40 wt % Talc Filled PEEK Laminate | | |
|---|---|---|---|---|---|---|
| | MD | CMD | Z | MD | CMD | Z |
| Mechanical Properties | | | | | | |
| Dimensional Stability, % (Method B) | −0.45 | −0.84 | N/A | −0.20 | −0.24 | N/A |
| Dimensional Stability, % (Method C) | −0.37 | −0.83 | N/A | −0.20 | −0.30 | N/A |
| Copper Peel Strength, N/cm (pli) | 7.70 (4.4) | | | 7.35 (4.2) | | |
| Thermal Properties | | | | | | |
| CTE (30° C. to 150° C.), ppm/° C. | 44.4 | 57.6 | 35.9 | 13.4 | 19.8 | 25.7 |
| Solder Resistance (60 sec), ° C. | >330 | | | >365 | | |
| Electrical Properties | | | | | | |
| Dielectric Breakdown Strength, V/mil | 1887 | | | 2425 | | |

Example 3

Two sheets of 50.8 micrometer (2 mil) thick unfilled PEEK film from Ajedium Film Group, LLC (Newark, Del.) were combined with on sheet of 1080/767 glass cloth (Hexcel Schwebel) in a hot oil vacuum press to make a melt laminated PEEK prepreg. This prepreg had a thickness of approximately 127 micrometer (5 mil) and was laminated at 350° C., 5.52 MPa (800 psi) for 60 minutes. A 50.8 micrometer (2 mil) PTFE release film was used on either side of the prepreg to prevent the PEEK from adhering to the stainless steel separator plates.

Example 4

The prepreg sheets of Example 3 were stacked between two sheets of 1-oz. TWS copper foil (Circuit Foils Luxembourg) to form unfilled PEEK reinforced copper clad laminates. These laminates were bonded at 350° C., 5.52 MPa (800 psi), for 60 minutes in an electrically heated press. The properties of these PEEK laminates shown in Table 2.

Example 5

Two sheets of 50.8 micrometer (2 mil) thick 40 wt % talc filled PEEK film from Ajedium Film Group, LLC (Newark, Del.) were combined with one sheet of 1080/767 glass cloth (Hexcel Schwebel) in a hot oil vacuum press to make a melt laminated PEEK prepreg. This prepreg had a thickness of approximately 127 micrometer (5 mil) and was laminated at 350° C., 5.52 MPa (800 psi) for 60 minutes. A 50.8 micrometer (2 mil) PTFE release film was used on either side of the prepreg to prevent the PEEK from adhering to the stainless steel separator plates.

Example 6

The prepreg sheets of Example 5 were stacked between two sheets of 1 Oz TWS copper foil (Circuit Foils Luxembourg) to form 40 wt % talc filled PEEK reinforced copper clad laminates. These laminates were bonded at 350° C., 5.52 MPa (800 psi) for 60 minutes in an electrically heated press. The properties of these PEEK laminates are shown in Table 2.

Example 7

Two sheets of 50.8 micrometer (2 mil) unfilled OXPEKK SP film from Oxford Performance Materials (Enfield, Conn.) were combined with one sheet of 1080/767 glass cloth (Hexcel Schwebel) in a hot oil vacuum press to make a melt laminated PEEK prepreg. This prepreg had a thickness of approximately 127 micrometer (5 mil) and was laminated at 350° C., 5.52 MPa (800 psi) for 60 minutes. A 50.8 micrometer (2 mil) PTFE release film was used on either side of the prepreg to prevent the OXPEKK SP from adhering to the stainless steel separator plates.

Example 8

The prepreg sheets of Example 7 were stacked between two sheets of 1-oz. TWS copper foil (Circuit Foils Luxembourg) to form unfilled OXPEKK SP reinforced copper clad laminates. These laminates were bonded at 350° C., 5.52 MPa (800 psi) for 60 minutes in an electrically heated press. The properties of these reinforced OXPEKK SP laminates are shown in Table 2.

TABLE 2

|  | Copper Bond Strength at 23° C., N/cm (pli) | Copper Bond Strength at 200° C., N/cm (pli) | Dielectric Constant at 10 GHz | Dissipation Factor at 10 GHz | 288° C./10 s/5x Solder Float |
|---|---|---|---|---|---|
| Unfilled PEEK | 7.88 (4.5) | 6.13 (3.5) | 3.29 | 0.0035 | Pass |
| 40 wt % talc-filled PEEK | 8.76 (5.0) | 8.93 (5.1) | 3.59 | 0.0034 | Pass |
| Unfilled OXPEKK SP | 9.11 (5.2) | 10.51 (6.0) | 3.44 | 0.0035 | Pass |

Example 9

Each of the laminates of Examples 4, 6, and 8 were combined with a 4 mil (3.18 mm) thick RO4450B prepreg (Rogers Corporation, USA) to create three different multi-layer circuit boards as shown in FIG. 4. In FIG. 4, three etched double clad circuit laminates, 410, 430 and 450 are separated by two bond ply layers 420 and 440. In laminates 410 and 450, the copper was fully etched off on one side only, leaving copper layers 412, 452. In laminate 430 the copper was fully etched off on both sides. The remaining conductive copper layers are labeled 460 and 480. The bond ply layers, 420 and 440, are each comprised of three sheets of ROGERS RO4450B.

The constructions were bonded using the manufacturers recommended lamination cycle. The reinforced multi-layer circuit assemblies exhibited excellent high temperature properties (Table 3).

TABLE 3

|  | T260, min | T288, min | 288° C./10 s/5x Solder Float |
|---|---|---|---|
| Unfilled PEEK | >30 | >30 | Pass |
| 40 wt % Talc-filled PEEK | >30 | >30 | Pass |
| Unfilled OXPEKK SP | >30 | >30 | Pass |

Example 10

Each of the laminates of Examples 4 and 6 were combined with 50.8 micrometer (2 mil) Ultralam 3908 bond ply (Rogers Corporation, USA) according to the layer diagram of FIG. 5 to produce multi-layer circuit boards. FIG. 5 shows five double clad laminates (510, 520, 530, 540, and 550) alternately stacked with four bond ply layers (519, 529, 539, and 549). The circuit assembly has a total of ten conductive copper layers (512, 518, 522, 528, 532, 538, 542, 548, 552, and 558) and five dielectric substrate layers (515, 525, 535, 545, and 555).

The constructions were bonded using the manufacturers recommended lamination cycle. Multiboard testing results for both non-reinforced unfilled PEEK (Example 4) and non-reinforced 40 wt. % talc-filled PEEK (Example 6) were essentially the same and are shown in Table 4.

TABLE 4

| Test | Results |
|---|---|
| 288° C./10 s/5x Solder Float | Pass. No blisters, warpage, or de-lamination |
| Interlayer Adhesion | Cohesive failure, >7.01 N/cm (4 pli) |

TABLE 4-continued

| Test | Results |
|---|---|
| T288 | Survives >30 min |
| Registration Control | Excellent. No resin flow, core movement. |

The above examples demonstrate the superior properties of PEEK circuit assemblies laminated with both thermoset and thermoplastic bonding layers when low loss, high temperature bond ply materials are used.

Comparative Examples

Various engineering thermoplastic resins were evaluated as core laminate materials. These resins were acquired from the respective suppliers and converted to molded plaques, uniaxial tape, or film. These products were then combined with 1080/767 woven glass to make prepregs as described in earlier examples. These prepregs were then combined to make cores and multi-layer boards using RO4450B prepreg as a bond ply layer. The resulting laminate and multi-layer properties are shown in Table 5 below. Also shown are the processing conditions used for each resin. All of the materials exhibited deficiencies in one or more critical properties.

From the results in Tables 5 and 6, it can be seen that Comparative Examples 11-14, 21, 23, and 24 all failed the requirement of a time to delaminate at 288° C. (T288) of greater than 30 minutes. Comparative examples 18 and 19 exhibited very low copper peel strength, while comparative examples 20-22 exhibited high loss. The PAEK-based materials, however, passed in every respect.

TABLE 5

| No. | Core Materials (Source) | Filler Type | Filler Loading, wt. % | Core Construction Type | Peak T, °C. | Pressure, psig (MPa) | Soak Time, min |
|---|---|---|---|---|---|---|---|
| 11 | Ultem 1000 (1) | None | 0% | Prepreg Based | 275 | 800 | 45 |
| 12 | Vectra A950 (2) | LT30 | 40% | Prepreg Based | 295 | 800 | 45 |
| 13 | Vectra A950 (2) | Coarse | 50% | Tri-Mack Molded Plaque | 325 | 800 | 60 |
| 14 | Vectra A130 (2) | Glass Fiber | 30% | Tri-Mack Molded Plaque | 310 | 800 | 60 |
| 15 | Vectra H950 (2) | LT30 | 50% | Tri-Mack Molded Plaque | 330 | 800 | 60 |
| 16 | Vectra T950 (2) | LT30 | 50% | Tri-Mack Molded Plaque | 395 | 800 | 60 |
| 17 | Zenite 7130 (3) | Glass Fiber | 30% | Tri-Mack Molded Plaque | 370 | 800 | 60 |
| 18 | Sumika Super E5006L (4) | Glass Fiber | 30% | Tri-Mack Molded Plaque | 430 | 800 | 60 |
| 19 | Ibuki (5) | Unknown | Unknown | Film Based | | | |
| 20 | RO4350B | CE44i | | Prepreg Based | 246 | 1000 | 60 |
| 21 | Zenite 77340 (3) | Mineral | 20% | Dupont Molded Sheet | 350 | 800 | 45 |
| 22 | Phoenixx PPS (6) | None | None | Cross-Plied Uniaxial Tape | 290 | 400 | 45 |
| 23 | Supradel (7) | None | N/A | Solvay Plaque | 350 | 800 | 45 |
| 24 | Ultem 5000 (1) | None | N/A | Prepreg Based | 300 | 800 | 45 |
| 25 | PEEK TL40 | Talc | 40% | Prepreg Based | 350 | 1000 | 30 |
| 26 | Ultem XXH (1) | None | None | Prepreg Based | 360 | 800 | 45 |
| 27 | OXPEKK SP (7) | None | 0% | Film Based | 310 | 800 | 45 |
| 28 | PEEK | None | 0% | Film Based | 350 | 1000 | 30 |

| No. | Copper Peel at 23° C., pli | Copper Peel at 200° C., pli | DK at 10 GHZ) | DF at 10 GHz) | 288 C./10 s/5x Solder Float | T260, min | T288, min | 288° C./10 s/5x Solder Float |
|---|---|---|---|---|---|---|---|---|
| 11 | 15.6 | 10.7 | 3.19 | 0.0035 | Pass | 0 | 0 | Pass |
| 12 | 10.6 | 1.3 | 3.43 | 0.0031 | Fail | 0 | 0 | Pass |
| 13 | 3.9 | 1.0 | 2.60 | 0.0035 | Fail | >30 | 0 | Fail |
| 14 | 5.8 | 1.5 | 3.88 | 0.0049 | Fail | >30 | 0 | Fail |
| 15 | 2.5 | 0.5 | 3.28 | 0.0038 | Fail | >30 | >30 | Pass |
| 16 | 2.9 | 0.6 | 3.27 | 0.0038 | Fail | >30 | >30 | Fail |
| 17 | 2.4 | 0.4 | 3.19 | 0.0068 | Fail | >30 | >30 | Pass |
| 18 | 2.2 | 0.5 | 3.40 | 0.0040 | Pass | >30 | >30 | Pass |
| 19 | 4.9 | 3.7 | 3.25 | 0.0053 | Pass | >30 | >30 | Pass |
| 20 | 4.2 | 1.6 | 3.49 | 0.0039 | Pass | >30 | >30 | Pass |
| 21 | 1.3 | Not tested | 3.04 | 0.0030 | Fail | >30 | >30 | Pass |
| 22 | 7.7 | 0.0 | 4.38 | 0.0091 | Fail | N/A | N/A | N/A |
| 23 | 5.0 | 0.5 | 3.18 | 0.0097 | Pass | 0 | 0 | Fail |
| 24 | 4.9 | 4.9 | 3.21 | 0.0036 | Pass | 0 | 0 | Pass |
| 25 | 5.0 | 5.1 | 3.59 | 0.0034 | Pass | >30 | >30 | Pass |
| 26 | 6.0 | 1.0 | 3.41 | 0.0046 | Pass | >30 | 2 | Pass |
| 27 | 5.2 | 6.0 | 3.44 | 0.0035 | Pass | >30 | >30 | Pass |
| 28 | 4.5 | 3.5 | 3.29 | 0.0035 | Pass | >30 | >30 | Pass |

(1) GE Plastics, Pittsfield, MA
(2) Ticona Corp. Summit, NJ
(3) Dupont Plastics, Wilmington, DE
(4) Sumitomo Chemical, Japan
(5) Mitsubishi Plastics, Inc. JP
(6) Phoenix TPC, Taunton MA
(7) Solvay Advanced Polymers, LLC, Alpharetta GA The singular forms "a," "an," and "the" include plural referents unless the context clearly dictates otherwise. The endpoints of all ranges directed to the same characteristic or component are independently combinable and inclusive of the recited endpoint. All references are incorporated herein by reference. As used herein and throughout, "disposed," "contacted," and variants thereof refers to the complete or partial physical contact between the respective materials, substrates, layers, films, and the like. Further, the terms "first," "second," and the like herein do not denote any order, quantity, or importance, but rather are used to distinguish one element from another.

While the invention has been described with reference to several embodiments thereof, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A circuit assembly, comprising
two or more circuit laminates, each comprising a conductive metal layer disposed on a poly(aryl ene ether ketone) dielectric substrate layer as a core material, wherein at least one of the conductive metal layers of each circuit laminate has been patterned to form a circuit; and
a thermoplastic bond ply layer disposed between the circuit laminates, wherein the bond ply has a melting point between 250° C. and 370° C., a $T_d$ of greater than about 290° C., wherein $T_d$ is the temperature at which the bond ply has a cumulative weight loss of 5% as measured by a thermogravimetric analyzer, and a dissipation factor of less than 0.01 at 10 GHz,
wherein at least one of the poly(aryl ene ether ketone) substrate layers is in contact with the bond ply layer and wherein the bond ply comprises a liquid crystalline polymer, polyimide, perfluoroalkoxy copolymer, fluorinated ethylene propylene, or polytetrafluoroethylene.

2. The circuit assembly of claim 1 wherein the bond ply comprises a liquid crystalline polymer.

3. The circuit assembly of claim 1 wherein the poly(aryl ene ether ketone) is polyether ether ketone.

4. The circuit assembly of claim 1 wherein the poly(aryl ene ether ketone) substrate layers further comprise a particulate filler.

5. The circuit assembly of claim 4 wherein the particulate filler is talc.

6. The circuit assembly of claim 5, wherein the talc is present in an amount of 5 to 60 weight percent based on a combined weight of the talc and the poly(aryl ene ether ketone).

7. The circuit assembly of claim 1, wherein the poly(arylene ether ketone) substrate layers further comprise a nonwoven web material.

8. The circuit assembly of claim 1, wherein the conductive metal is stainless steel, copper, aluminum, zinc, iron, a transition metal, or an alloy comprising at least one of the foregoing.

9. The circuit assembly of claim 1, wherein the conductive metal is copper.

10. The circuit assembly of claim 1, wherein the poly(aryl ene ether ketone) substrate layers have a dielectric constant of less than 4 when measured over 1 to 10 GHz.

11. The circuit assembly of claim 1, wherein the poly(arylene ether ketone) substrate layers have a UL-94 flammability rating of V-0.

12. The circuit assembly of claim 1, wherein the poly(arylene ether ketone) substrate layer comprises 20 to 50 weight percent particulate filler, based on a total weight of the dielectric substrate, and has a coefficient of thermal expansion of less than 25 ppm/° C. measured from 30 to 150° C. in a machine direction and cross-machine direction.

13. The circuit assembly of claim 1, wherein at least one of the conductive metal layers is in contact with the bond ply layer.

14. A method of forming a circuit assembly comprising
forming a layered structure comprising two or more circuit laminates, each comprising a conductive metal layer disposed on a poly(arylene ether ketone) substrate layer as a core material, wherein at least one of the conductive metal layers of each circuit laminate has been patterned to form a circuit; and a thermoplastic bond ply layer disposed between the circuit laminates, wherein the bond ply has a melting point between 250° C. and 370° C., a $T_d$ of greater than about 290° C., wherein $T_d$ is the temperature at which the bond ply has a cumulative weight loss of 5% as measured by a thermogravimetric analyzer, and a dissipation factor of less than 0.01 at 10 GHz, and
laminating the layered structure to form a circuit assembly,
wherein at least one of the poly(aryl ene ether ketone) substrate layers is in contact with the bond ply layer and wherein the bond ply comprises a liquid crystalline polymer, polyimide, perfluoroalkoxy copolymer, fluorinated ethylene propylene, or polytetrafluoroethylene.

15. The method of claim 14 wherein laminating is at 275 to 290° C. and 0.7 to 2.1 MPa.

16. A circuit assembly, comprising
two or more circuit laminates, each comprising a conductive metal layer disposed on a poly(aryl ene ether ketone) substrate layer as a core material, wherein at least one of the conductive metal layers in each of the circuit laminates has been patterned to form a circuit; and
a thermoset bond ply layer disposed between the conductive metal layers, wherein the bond ply has a dissipation factor of less than 0.01 at 10 GHz and a $T_d$ of greater than about 290° C., wherein $T_d$ is the temperature at which the bond ply has a cumulative weight loss of 5% as measured by a thermogravimetric analyzer, and
wherein at least one of the poly(aryl ene ether ketone) substrate layers is in contact with the bond ply layer and further wherein the bond ply comprises a polybutadiene polymer, a polyisoprene polymer, a mixture of a polybutadiene polymer and a polyisoprene polymer, or an expanded polytetrafluoroethylene impregnated with thermosetting material.

17. The circuit assembly of claim 16 wherein the bond ply comprises a polybutadiene polymer, a polyisoprene polymer, or a mixture of polybutadiene polymer and polyisoprene polymer.

18. A method of forming a circuit assembly comprising
forming a layered structure comprising two or more circuit laminates, each comprising a conductive metal layer disposed on a poly(arylene ether ketone) substrate layer as a core material, wherein at least one of the conductive metal layers in each circuit laminate has been patterned to form a circuit; and a thermosetting bond ply layer disposed between the circuit laminates; and
laminating the layered structure to form a circuit assembly, wherein the bond ply in the circuit assembly has a dissipation factor of less than 0.01 at 10 GHz and a $T_d$ of greater than about 290° C., wherein $T_d$ is the temperature at which the bond ply has a cumulative weight loss of 5% as measured by a thermogravimetric analyzer, and
wherein at least one of the poly(aryl ene ether ketone) substrate layers is in contact with the bond ply layer, and further wherein the bond ply comprises a polybutadiene polymer, a polyisoprene polymer, a mixture of a polybutadiene polymer and a polyisoprene polymer, or an expanded polytetrafluoroethylene impregnated with thermosetting material.

19. The method claim 18 wherein thermosetting bond ply layer is partially or fully cured.

20. The method of claim 18 wherein laminating is at about 150 to about 230° C. and about 0.345 to about 3.45 MPa.

21. The method of claim 18 wherein the bond ply comprises a polybutadiene polymer, a polyisoprene polymer, or a mixture of polybutadiene polymer and polyisoprene polymer.

* * * * *